(12) United States Patent
Blodgett (10) Patent No.: US 7,606,102 B2
(45) Date of Patent: Oct. 20, 2009

(54) MEMORY ADDRESS REPAIR WITHOUT ENABLE FUSES

(75) Inventor: Greg Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/509,310

(22) Filed: Aug. 24, 2006

(65) Prior Publication Data

US 2007/0058462 A1    Mar. 15, 2007

Related U.S. Application Data

(63) Continuation of application No. 10/924,300, filed on Aug. 23, 2004, now Pat. No. 7,116,590.

(51) Int. Cl.
*G11C 17/18* (2006.01)

(52) U.S. Cl. ............... 365/225.7; 365/200; 365/191

(58) Field of Classification Search ............... 365/200, 365/225.7, 191
See application file for complete search history.

(56) References Cited

U.S. PATENT DOCUMENTS

| | | | |
|---|---|---|---|
| 4,881,202 A | 11/1989 | Tsujimoto et al. | |
| 5,383,156 A | 1/1995 | Komatsu | |
| 5,732,029 A | 3/1998 | Lee et al. | |
| 5,798,974 A | 8/1998 | Yamagata | |
| 5,828,624 A * | 10/1998 | Baker et al. | 365/230.06 |
| 5,831,916 A * | 11/1998 | Berger | 365/200 |
| 6,002,620 A * | 12/1999 | Tran et al. | 365/200 |
| 6,317,370 B2 | 11/2001 | Shirley | |
| 6,980,478 B1 | 12/2005 | Alejano et al. | |
| 7,006,393 B2 | 2/2006 | Merritt et al. | |
| 7,006,394 B2 | 2/2006 | Cowles et al. | |
| 7,031,218 B2 * | 4/2006 | Hoffmann et al. | 365/225.7 |
| 7,139,209 B2 | 11/2006 | Alejano et al. | |
| 7,218,561 B2 | 5/2007 | Cowles et al. | |
| 7,376,025 B2 | 5/2008 | Merritt et al. | |

* cited by examiner

*Primary Examiner*—Hoai V Ho
*Assistant Examiner*—Kretelia Graham
(74) *Attorney, Agent, or Firm*—Jones Day; Edward L. Pencoske (57) ABSTRACT

A memory chip design methodology is disclosed wherein fuse banks on the memory chip may be implemented without enable fuses. A fuse bank may be enabled by using one or more least significant bits (LSBs) in the memory address stored in the fuse bank, thereby avoiding the need for a separate enable fuse. A reduction in the number of fuses results in space savings on the memory chip real estate and also savings in power consumption because of fewer fuses to be blown and read. With reduced fuse count, the yield of the memory chip's die may also be improved because of less number of defective fuses or failed fuse blows. The use of effective default state inversion for address fuses may further reduce the average number of fuses that need to be blown to repair a given non-redundant memory address. Because of the rules governing abstracts, this abstract should not be used to construe the claims.

7 Claims, 8 Drawing Sheets

MEMORY ADDRESS REPAIR WITHOUT ENABLE FUSES

The present application is a continuation of U.S. patent application Ser. No. 10/924,300 filed Aug. 23, 2004 now U.S. Pat. No. 7,116,590 and entitled Memory Address Repair Without Enable Fuses.

BACKGROUND

1. Field of the Disclosure

The present disclosure generally relates to memory systems and, more particularly, to a system and method to repair memory addresses without enable fuses.

2. Brief Description of Related Art

Figure 1:
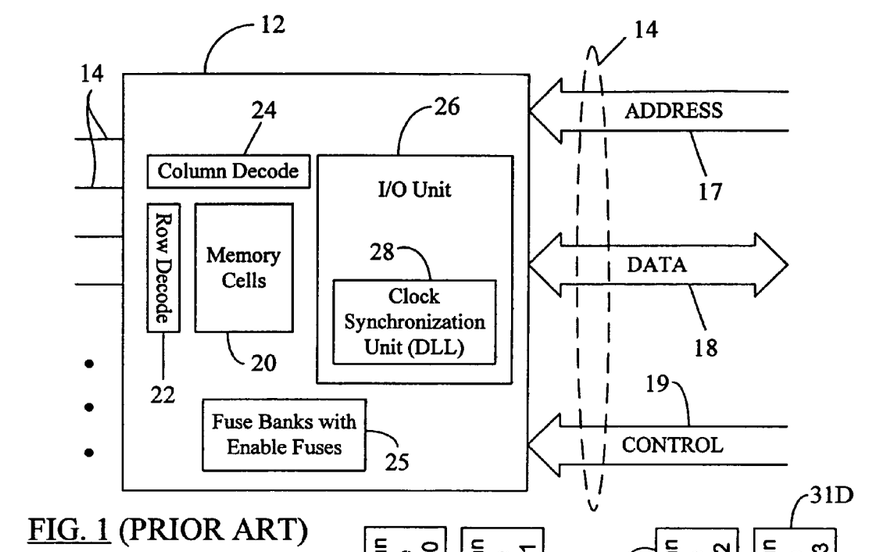
FIG. 1 is a simplified block diagram showing a memory chip or memory device.

FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins 14 located outside of chip 12 for electrically connecting the chip 12 to other system devices. Some of those pins 14 may constitute memory address pins or address bus 17, data pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address strobe (RAS) signal, a column address strobe (CAS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 20. However, these peripheral devices or circuits are not shown in FIG. 1 for the sake of clarity.

The memory chip 12 may include a plurality of memory cells 20 generally arranged in rows and columns to store data in rows and columns as discussed hereinbelow with reference to FIGS. 2A-2B. Each memory cell 20 may store a bit of data. A row decode circuit 22 and a column decode circuit 24 may select the rows and columns in the memory cells 20 in response to decoding an address, provided on the address bus 17. Data to/from the memory cells 20 is then transferred over the data bus 18 via sense amplifiers and a data output path (not shown). A memory controller (not shown) may provide relevant control signals (not shown) on the control bus 19 to control data communication to and from the memory chip 12 via an I/O (input/output) unit 26. The I/O unit 26 may include a number of data output buffers (not shown) to receive the data bits from the memory cells 20 and provide those data bits or data signals to the corresponding data lines in the data bus 18. The I/O unit 26 may further include a clock synchronization unit or delay locked loop (DLL) 28 to synchronize the external system clock (e.g., the clock used by the memory controller (not shown) to clock address, data and control signals between the memory chip 12 and the controller) with the internal clock used by the memory 12 to perform data write/read operations on the memory cells 20.

The memory controller (not shown) may determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates with other devices connected thereto via the pins 14 on the chip 12. These pins, as mentioned before, may be connected to appropriate address, data and control lines to carry out data transfer (i.e., data transmission and reception) operations.

The memory chip 12 may also include a plurality of fuse banks 25 wherein each fuse bank may be activated when its corresponding enable fuse is blown as discussed later hereinbelow. A fuse bank allows selection of a redundant memory location when a non-redundant or actual memory location corresponding to an address stored in the fuse bank is defective. For example, a state of the art DRAM (Dynamic Random Access Memory) device may have anywhere from 128 Megabits (1024×1024×128) to 1 Gigabits (1024×1024×1024) or more of data storage. Each memory bit is made up of a storage cell capacitor and an access device transistor. With such large numbers of bits, there is nearly a 100% chance that any one memory device or chip will have multiple defective bits. To compensate for these defects, redundant bits or redundant memory cells are manufactured into the memory array to logically replace defective bits. For every 1024 rows, there may be two or four additional redundant rows, and for every 1024 columns, there may be four or eight additional redundant columns.

Figure 2A:
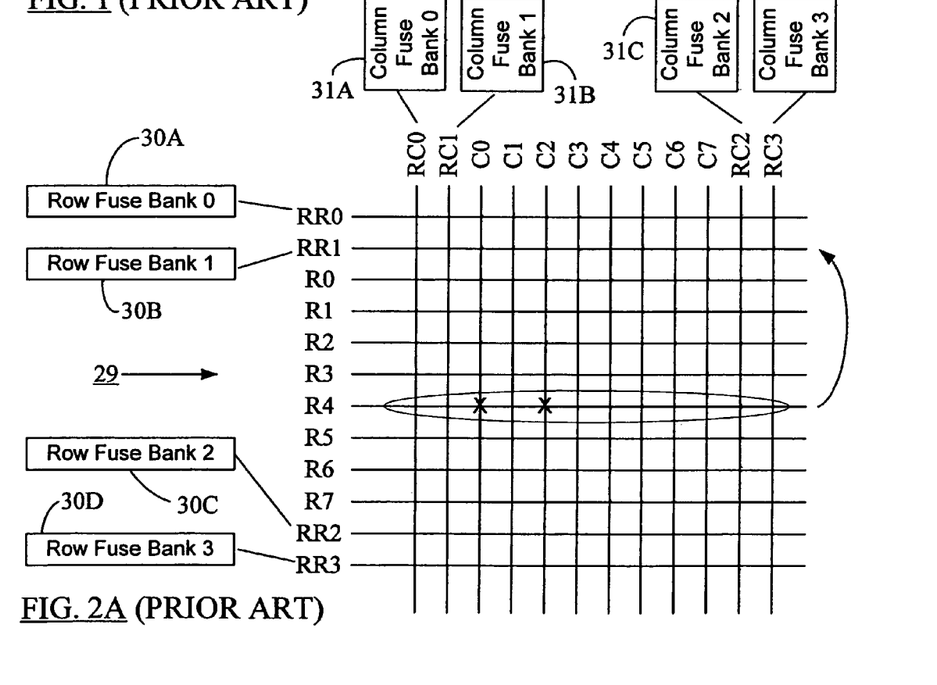
FIGS. 2A-2B depict exemplary sets of memory cells and associated fuse bank arrays.
Figure 2B:
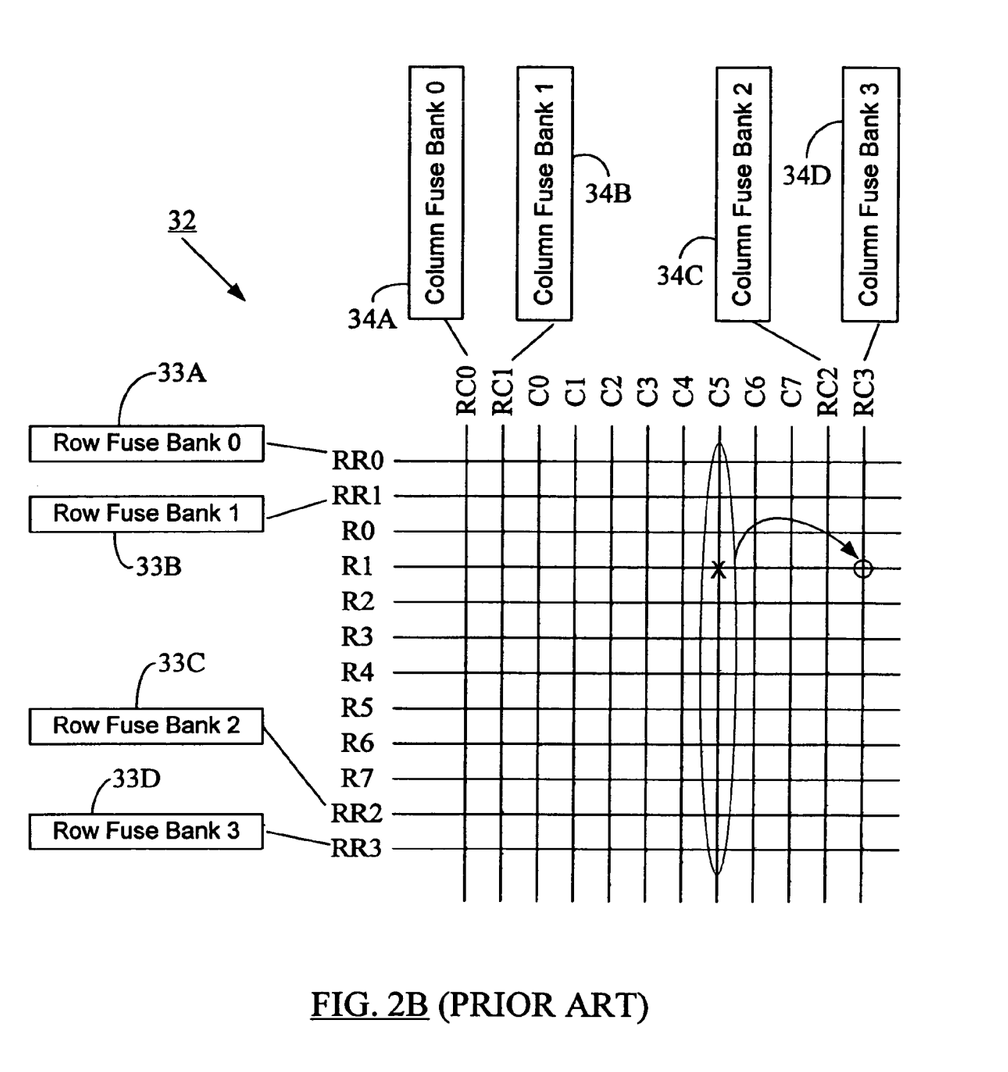

FIGS. 2A-2B depict exemplary sets of memory cells 29, 32 and associated fuse bank arrays 30-31, 33-34. As shown in FIGS. 2A-2B, the memory cells (e.g., the memory cells 20 in FIG. 1) may include a non-redundant or "actual" memory array containing rows R0-R7 and columns C0-C7, and corresponding redundant or "backup" memory containing rows RR0-RR3 and columns RC0-RC3. Each cell in the memory array may be identified by its corresponding row and column address. In the memory cells 29 and 32, there are 12×12=144 memory cells, which include "actual" and "redundant" memory locations. As noted before, the small number of redundant memory cells are also provided on the chip 12 to prevent data storage errors in case of the presence of any defective bits or cells in the non-redundant memory locations defined by rows R0-R7 and columns C0-C7 in the illustrations in FIGS. 2A and 2B.

Typically, separate redundant memory arrays are not used. Rather, redundant rows (RR) and redundant columns (RC) are added to the main array (e.g., the array defined by rows R0-R7 and columns C0-C7 in FIGS. 2A, 2B). In the configuration of FIG. 2A, for example, if there are one or more defective cells or bad bits in the fifth row (R4) at columns C0 and C2, then these bad bits may be repaired by using redundant row-1 (RR1) instead of "regular" row R4 as shown in FIG. 2A. As another example, FIG. 2B illustrates that a bad bit at R1-C5 is repaired by using redundant column-3 (RC3). In this case, row-1 (R1) will still be used during data transfer, but when column-5 (C5) is addressed (for any row), the redundant column RC3 will be used instead of C5. The selection and activation of a redundant row/column is typically performed using a corresponding fuse bank as discussed below.

It is also possible to repair bad redundant bits. For example, if RR1 has a bad bit at C2, one of the redundant columns can be used to repair it (e.g., column RC0). In this case, RR1 may be used in place of R4 (as shown in FIG. 2A), and RC0 may be used in place of C2 (in a manner similar to that illustrated and discussed with reference to FIG. 2B). Therefore, typically, single defective memory locations are not repaired by selecting the row and column of that bad location, but rather by replacing an entire row or column of memory elements with a redundant row or column.

Each redundant row and column requires nonvolatile circuitry to store the address of the defective memory element that the redundant element is to logically replace. Additionally each redundant element may have a nonvolatile programmable enable bit to enable the redundant element to replace the defective element if the address of the defective element is detected. The nonvolatile address and enable storage is typically made up of laser fuse or electrical antifuse elements—generically called fuses. For laser fuses, lines are drawn in a material such that they can be cut open with a laser to change the state of the fuse from a short circuit or low impedance to an open circuit or high impedance. An antifuse may be comprised of a capacitor which is a high impedance or open circuit that can be blown when a high voltage is applied across the capacitor plates. When the antifuse is blown, the capacitor plates are shorted out, and the device has a short circuit or low impedance characteristic. Typically a signal is applied to the fuse element, and the low impedance or high impedance state is detected and stored in a latch. The output of the latch for the enable fuse is used as the enable signal for the associated redundant row or column array element.

In FIGS. 2A and 2B, a fuse bank array is shown having a set of row fuse banks (30A-30D, 33A-33D) and a set of column fuse banks (31A-31D, 34A-34D). The fuse bank array may be part of the fuse banks 25 on the memory chip 12 in FIG. 1. Thus, there are four row fuse banks (30A-30D, 33A-33D) in the fuse bank arrays in FIGS. 2A-2B to correspond to the four redundant rows RR0-RR3, and there are four column fuse banks (31A-31D, 34A-34D) associated with the four redundant columns RC0-RC3. The row and column fuse banks are used to store memory addresses of respective non-redundant rows/columns that are found to be defective. Based on the match between the address stored in a fuse bank and the address presented on the address bus 17, an associated redundant memory location may be selected to store data in place of the non-redundant location specified in the address on the bus 17. Thus, the redundant memory elements (rows and columns) may not actually have corresponding address lines to decode them (contrary to the address lines for the non-redundant memory elements) so as to directly access the redundant rows. Instead, the redundant elements may be directly wired to corresponding fuse banks and selected/activated using the status (blown or unblown) of fuses in the corresponding fuse banks. That is, the address presented on the address bus 17 may always refer to a memory element in the non-redundant memory array 30 and there may not be a separate "redundant memory address" in the system.

In the discussion herein, the term "fuse bank" refers to a set of address fuses and one enable fuse associated therewith—the fuse elements—in the memory chip 12 as discussed later hereinbelow with reference to FIG. 4. Thus, as noted before, when the (row/column) address stored in the fuse bank matches with the memory address presented (e.g., on the address bus 17), then the redundant element associated with that bank of fuses is activated. It is thus observed that the combination of all of the values of the fuse elements (blown or unblown) in a fuse bank constitutes a memory address that is to be repaired. That is, the redundant memory element (row or column) associated with that fuse bank is to be used instead of the non-redundant or "regular" memory element at that address (i.e., the memory element whose address was provided on the address bus 17).

Figure 3:
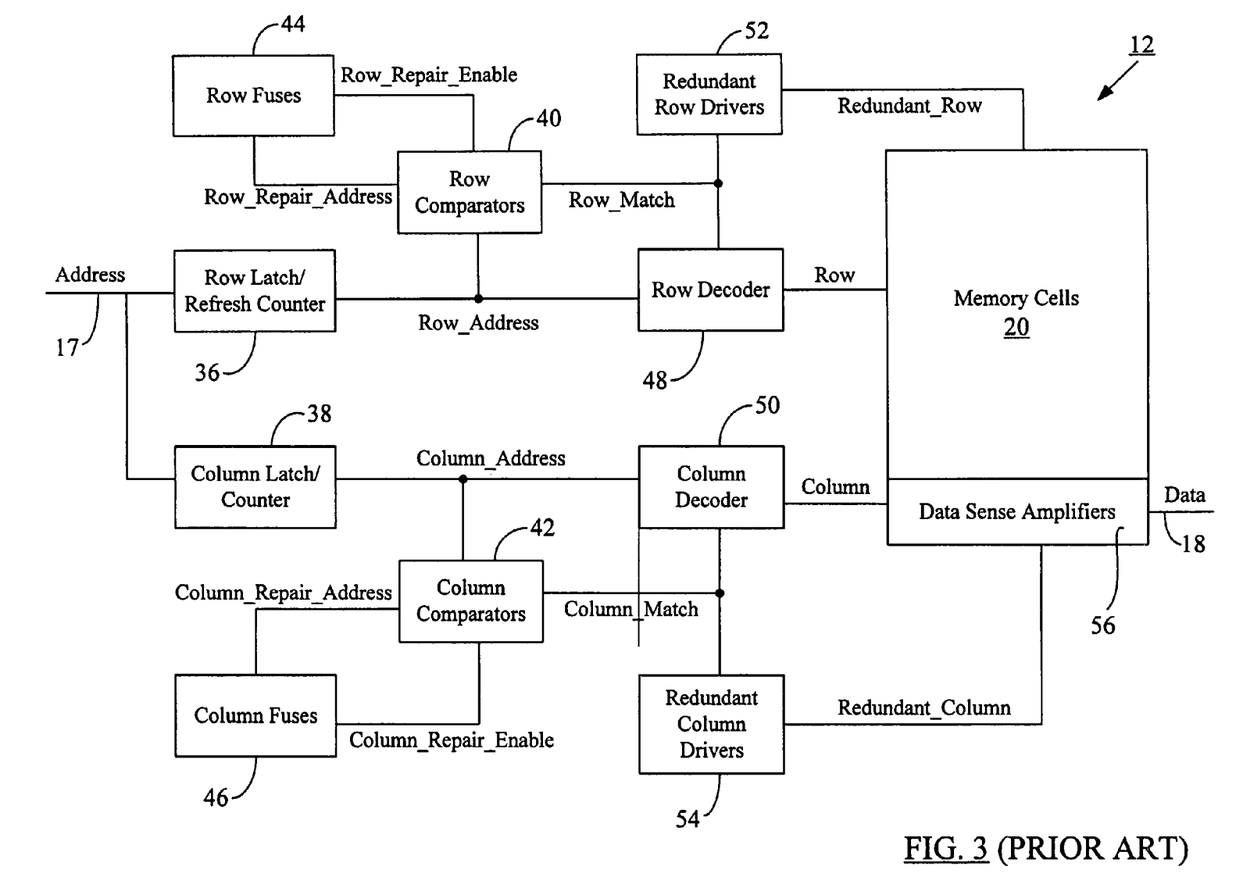
FIG. 3 shows a high level block diagram of an exemplary memory address path in the memory chip in FIG. 1.

FIG. 3 shows a high level block diagram of an exemplary memory address path in the memory chip 12 in FIG. 1. As is known, a memory "address" is typically a multiplexed address input that is used to present (through the address bus 17) a row address and then a column address to the memory device 12. A memory "address" may be 14 bits of address information and may have different numbers of active bits for row addresses versus column addresses. The externally-received memory address (constituting row address and column address portions) is shown presented at the address line/bus 17 in FIG. 3. For the sake of simplicity, only one address line 17 is shown in FIG. 3 instead of a group of address lines constituting the address bus 17. As noted before, the address on line 17 is for a memory element in a non-redundant memory array (e.g., the memory array of R0-R7:C0-C7 in FIGS. 2A-2B). The row address portion is latched in the row latch/counter 36. The row address counter 36 provides the row address for Auto Refresh or for Self Refresh modes. The column address is latched in the column latch/counter 38. The column address counter 38 provides subsequent column addresses within a burst read or write data access. The row and column addresses are also presented to the row and column redundancy comparators 40, 42, respectively, to determine if the current address (on line 17) is a match to a previously detected failing address. If a row address matches an address stored in the row fuse banks (shown, for example, in FIG. 2A) and the associated row fuse bank enable is true (as indicated by the blown status of the corresponding enable fuse), then a redundant row address is to be used in place of the normal row address. Likewise for the column address.

In FIG. 3, the block labeled Row Fuses 44 will typically contain many banks of row address fuses each with a corresponding enable fuse. Likewise for the block Column Fuses 46. The row and column address are also presented to the row and column address decoders 48, 50, respectively. The decoders are used to decode the address (of the non-redundant memory element) to activate the corresponding row line or column select line to access the addressed memory cell in the set of memory cells 20. If a redundant match occurs (as indicated by the outputs of the comparators 40 and 42), typically the normal (non-redundant) memory element will be disabled. That is, the normal row line will not be activated if a redundant row line is activated. Hence, the match signals from comparators 40, 42 are used as enable signals for the redundant element drivers 52, 54 and as a disable for the normal decoders 48, 50. However, some memory devices may choose to activate both a redundant element and a normal element and use the match signal to determine which data lines to/from the array contain valid information. As noted before, the memory cells 20 may contain non-redundant and redundant memory elements. Thus, in the embodiment of FIG. 3, the memory cell array 20 receives the row and column signals and enables access to the associated memory element (redundant or non-redundant). The output from the selected memory cell(s) is supplied to the data line/data bus 18 via data sense amplifiers 56 as is known in the art. It is noted here that for the sake of simplicity, only one data line 18 is shown in FIG. 3 instead of a set of data lines constituting the data bus 18.

Figure 4:
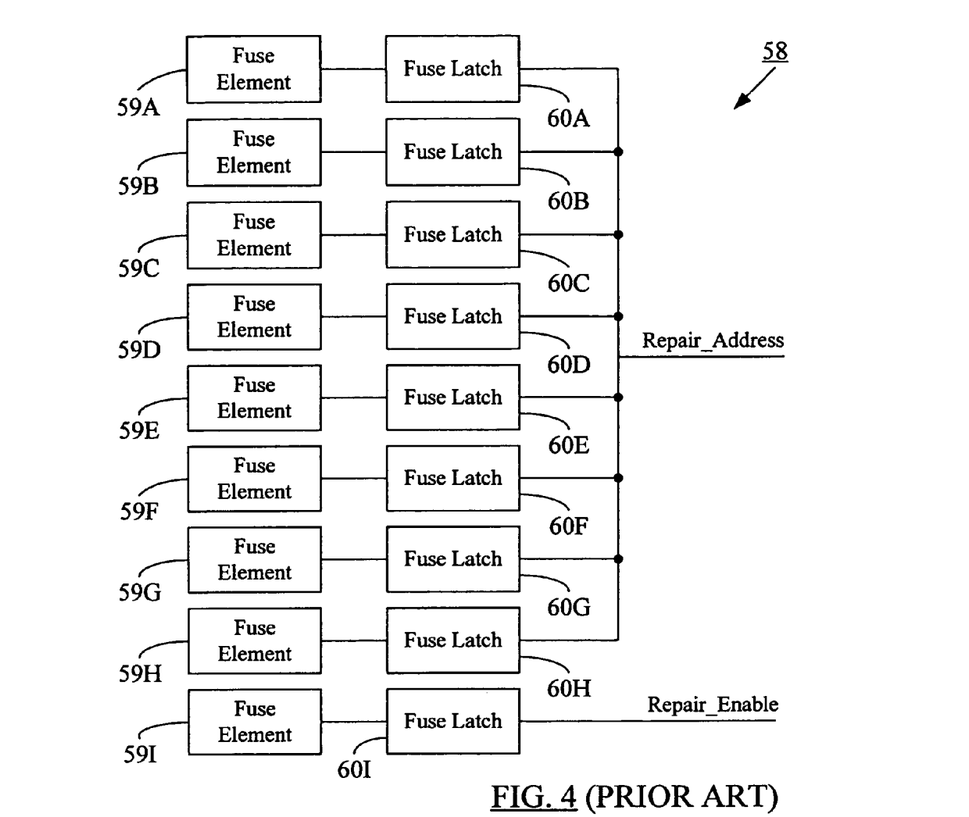
FIG. 4 is a block level diagram of a fuse bank.

FIG. 4 is a block level diagram of a fuse bank 58. The fuse bank 58 may be one of the fuse banks in the row and column fuse banks shown in FIGS. 2A-2B. In the example of FIG. 4, eight fuses 59A-59H are provided to store an address (row or column address) of a non-redundant memory element to be repaired. An additional fuse 59I is provided as an enable fuse for the fuse bank 58. Each fuse element 59A-59I has an associated fuse latch 60A-60I, respectively, to store the state of the fuse therein (i.e., the address information stored in the corresponding fuse element and the enable status). The fuses 59A-59I may be read (and, hence, their outputs latched) periodically upon refresh or at some other predetermined intervals. The outputs of all fuse latches 60A-60I may then be provided to respective memory address comparator circuits (e.g., comparators 40 and 42 in FIG. 3). It is not necessarily required that every non-redundant memory address bit have an associated fuse. That is, in case of an 8-bit address in FIG. 4, there may be less than eight fuse elements in the fuse bank 58. Some address bits may be used to determine which fuse banks are to be used, or a single fuse bank may match multiple addresses. This allows for a single fuse bank to have a larger repair region on the device, where the other non-compared address bits are used in combination with the match signal (e.g., a signal generated by the row comparator 40 or the column comparator 42 in FIG. 3) to select the appropriate redundant element to activate. In any event, the enable fuse element 59I still remains present as part of the fuse bank 58.

Figure 5:
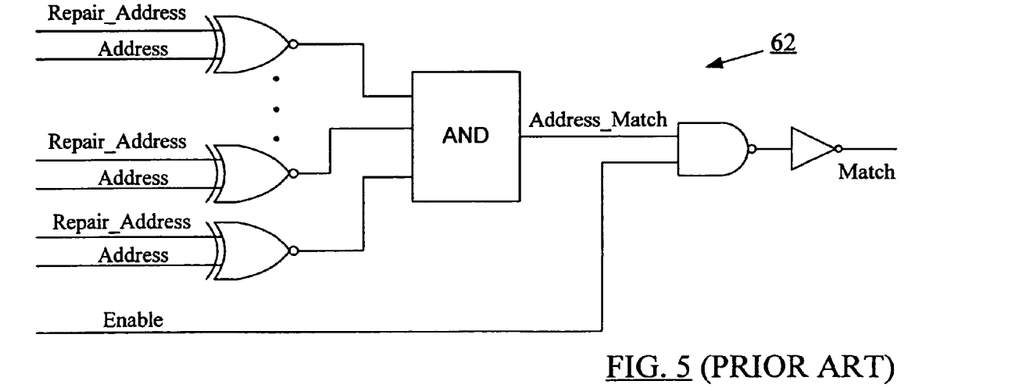
FIG. 5 is a high level diagram of a comparator circuit that may be part of the row comparators or the column comparators in FIG. 3.

FIG. 5 is a high level diagram of a comparator circuit 62 that may be part of the row comparators 40 or the column comparators 42 in FIG. 3. The repair address (e.g., the address output from the fuse latches 60A-60H in FIG. 4) and the address on line 17 are compared by exclusive NORing each of the corresponding bits together. If the bits are the same, the output of the XNOR is high. If all XNOR outputs for a given fuse bank are "high", then all address bits match. All XNOR outputs are ANDed together to form the first address match signal (the Address_Match signal in FIG. 5). The enable signal from the enable fuse latch 60I is ANDed with the Address_Match signal to form the "Match" signal, which may be output as the Row_Match signal or the Column_Match signal (depending on whether row or column addresses are being compared) indicated in FIG. 3. Different logic methods of performing this compare function are well known in the art.

All fuses in the fuse banks 25 on the memory chip 12 are typically read shortly after power is applied to the chip 12. The fuse status or address information read from the fuse elements is stored in corresponding latches. The output of the latches will be all low or all high for unprogrammed fuses depending on the fuse technology (there will be a default unprogrammed state for a laser fuse or an electrical antifuse element). If this default state is all low, for example, then this unprogrammed address would match an applied address of all zeros. To differentiate between an unprogrammed fuse bank, and one intended to replace a defective non-redundant memory element at address zero, the enable fuse is required. If the enable fuse is blown, and the fuse address matches with the externally-supplied address on line 17, then the redundant element associated with that fuse bank is used. Likewise if the default or unprogrammed state is all ones, then the enable fuse is used to differentiate between an address of all ones and an unblown set of addresses in a fuse bank.

In operation, the defective address information stored in fuses is read and stored in latches after power is applied to the device 12. When a row address is applied to the device 12 (on the address bus 17), any redundant row that may be used to replace the row being addressed has its stored fuse address compared to the row address to see if it is a match. If it does match, and if the associated enable fuse is also blown, then the normal (non-redundant) row is not turned on, but rather the redundant row is used. It is possible to have a design where both the redundant and normal row turn on, but data associated with the redundant one is selected for use. Typically, the selection/activation of normal row or column is slightly delayed because the address compare circuitry (e.g., the comparators 40, 42 in FIG. 3) needs some time to perform the address comparison and generate a match signal which is used to turn on the redundant element and prevent the normal element from turning on.

SUMMARY

The inventors have recognized that, as noted before, a gigabit DRAM chip will typically have tens of thousands of individual fuses. Some issues associated with the fuses on a memory chip are: (1) Power is required to read the fuses. If a voltage is applied to an open fuse, then very little power is consumed. However, if a voltage is applied to a short circuited fuse, then current flows and power is consumed. Therefore there is an advantage in having fewer unblown laser fuses, or fewer blown antifuses. The fuses do not need to be read continuously if the data from the fuses is stored in static latches. (2) It takes time to blow or "program" the fuses. Programming a fuse is a relatively fast operation, but when each semiconductor die requires a unique pattern of thousands of fuse blows, the time adds up. (3) Fuse elements tend to be large in size. For laser fuses, the material to be cut must be drawn in an isolated area on the die, with features and spaces which are large enough for the laser to resolve. For electrical fuses, large transistors and metal lines are required to carry the relatively large currents required to blow the fuses. (4) With tens of thousands of fuses on the die, there is a growing potential for defective fuses or failed fuse blows, which limit die yield.

It has been suggested that most enable fuses could be removed from the chip real estate if the presence of any blown fuse is used as an enable condition. However, there would still be some banks with enable fuses to specifically allow the repair of address zero because no address fuses are blown for this address of all zeros and, hence, no enable condition may be detected without the enable fuse. Likewise, in the case where the default address condition for fuses is to match a high address, there would be no way to selectively repair an address of all 1's.

The present disclosure contemplates a system and method that addresses the above concerns. In one embodiment, the present disclosure contemplates a memory chip where none of the memory fuse banks has an enable fuse, thereby reducing the number of fuses on the semiconductor die for the memory chip. In another embodiment, perceived default state of some fuse elements is inverted to reduce the number of fuses that need to be blown to match the defective non-redundant memory address.

The present disclosure also contemplates a method that comprises: selecting a fuse bank having a plurality of fuse elements, wherein each of the plurality of fuse elements provides a corresponding bit of an internal memory address signal that relates to a first memory address of a defective memory location; selecting at least one bit of the internal memory address signal; and generating an enable signal from the selected bit.

In an alternative embodiment, the present disclosure contemplates a method, which comprises: selecting a memory fuse bank having a default address that substantially matches with a memory address of a defective memory location, wherein the default address constitutes a plurality of memory address signals, wherein the memory fuse bank includes a plurality of fuse elements, and wherein each of the plurality of fuse elements provides a corresponding one of the plurality of memory address signals; and changing the state of only those of the plurality of fuse elements whose corresponding memory address signals fail to match with respective address bits in the memory address of the defective memory location.

A memory device constructed according to a fuse design methodology according to the present disclosure and a computer system employing such memory device are also contemplated.

The present disclosure teaches a memory chip design methodology wherein fuse banks on the memory chip may be implemented without enable fuses. A fuse bank may be enabled by using one or more least significant bits (LSBs) in the memory address stored in the fuse bank, thereby avoiding the need for a separate enable fuse. A reduction in the number of fuses results in space savings on the memory chip real estate and also savings in power consumption because of fewer fuses to be blown and read. With reduced fuse count, the yield of the memory chip's die may also be improved because of less number of defective fuses or failed fuse blows. The use of effective default state inversion for address fuses may further reduce the average number of fuses that need to be blown to repair a given non-redundant memory address.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to certain embodiments of the present disclosure, examples of which are illustrated in the accompanying figures. It is to be understood that the figures and descriptions of the present disclosure included herein illustrate and describe elements that are of particular relevance to the present disclosure, while eliminating, for the sake of clarity, other elements found in typical data storage or memory systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

Figure 6:
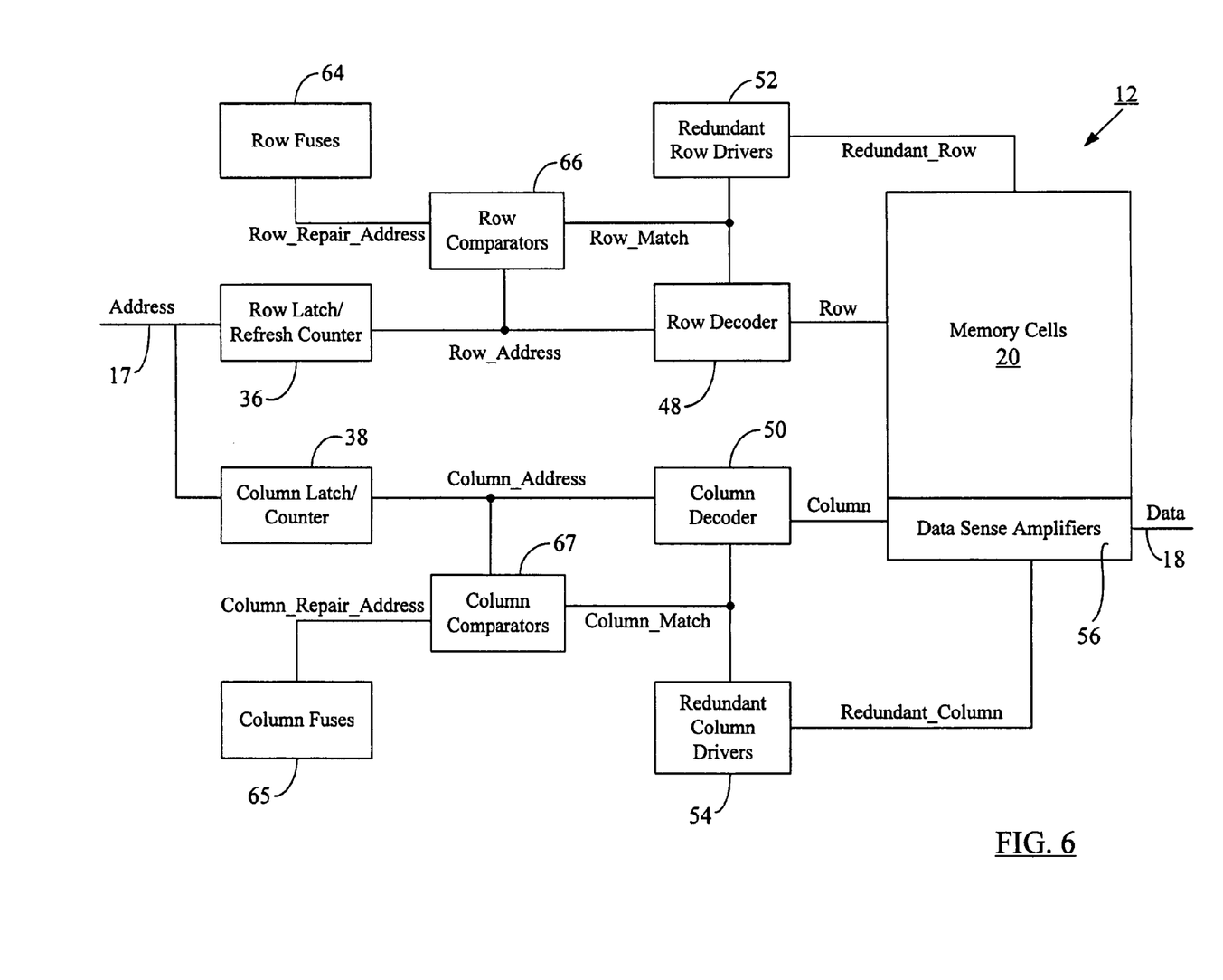
FIG. 6 shows a high level block diagram of an exemplary memory address path according to one embodiment of the present disclosure.

FIG. 6 shows a high level block diagram of an exemplary memory address path according to one embodiment of the present disclosure. A comparison of FIGS. 3 and 6 shows that both are quite similar (and, hence, similar circuit blocks or elements in FIGS. 3 and 6 are labeled with identical reference numerals), except for the blocks labeled Row Fuses 64, Column Fuses 65, Row Comparators 66, and Column Comparators 67. As discussed hereinbelow, the Row Fuses 64 and Column Fuses 65 may not contain any enable fuses. Because of the absence of enable fuses, the Row Comparators 66 and the Column Comparators 67 may contain comparator circuits (some examples of which are illustrated in FIGS. 7-11 and discussed later hereinbelow) that are different from the comparator configuration illustrated in FIG. 5. In view of substantial similarity between FIGS. 3 and 6 in other respects, additional discussion of FIG. 6 is not provided herein. It is seen from FIG. 6 that the memory address path of FIG. 6 may be used in place of the memory address path of FIG. 3. Therefore, reference numeral "12" is used in FIG. 6 to indicate that the memory chip 12 in FIG. 1 may be configured to contain the memory address path of FIG. 6 in place of that of FIG. 3.

The present disclosure covers the usefulness of effectively changing the perceived default state of some fuse elements. Because the fuses are read after power is applied to the part (e.g., the memory chip 12 in FIG. 1) and before any memory read or write operations occur, the fuse read time may not be very critical. For some fuses, it may be a simple matter to add an inverter circuit somewhere in the path between the fuse and the output coming from the fuse latch. For fuses which are default low (e.g., laser fuses), the inverter would make them look like they are default high, which may allow for an increase in the number of laser fuses that can be blown to an open circuit state or a decrease in the number of antifuses that need to be blown to a short circuit state in order to match a given memory address of a defective memory element. Another way to accomplish an effective default state inversion for memory address fuses is to use an inverted address signal (i.e., the address signal present on the address bus 17) to compare against the address stored in the fuse. In this situation, a fuse element with a default state of zero matches an address bit (of a non-redundant memory location) if the address bit is zero, but if the address bit is inverted, then the match will occur if the address is a one. This effectively implies that for those bits where the address is inverted, the default match state for the fuse has also been inverted from a zero to a one.

Thus, in one embodiment of the present disclosure, the fuse banks may be divided or broken up into elements with a variety of different default address states. A fuse element's default state inversion may be accomplished by simply inverting selected address bits (on the address lines 17) before the address comparators (e.g., the comparators 66 and 67 in FIG. 6). This may be done almost free of additional circuit logic if the address repeaters (not shown) that are already present on the memory chip 12 are used as inverters. It is observed that the address repeaters (not shown) can be simple inverters that are used to buffer the address signals as they propagate across the memory chip 12. Adding in repeaters has become a requirement as metal lines have gotten more and more narrow. The narrow lines are more resistive, and the RC time constant of the long lines can cause large time delays if the signals are not buffered.

By using a fuse bank with the closest default address to the desired address (i.e., the address to be repaired), it may be possible to significantly reduce the number of fuses that need to be blown to match the bad address. It is observed here that a fuse default address is determined upon design of the memory chip 12 depending, for example, on the observed failure or defects in the memory cells on the die containing the chip 12. For example, there may be a pattern or trend of higher probability of repair near the edges of the memory arrays or chips on a semiconductor die. In that case, many fuse banks on the chip 12 may store addresses having all MSB's (Most Significant Bits) with high or low default values (depending on the fuse type or the availability of default state inversion). Benefits of selecting (or designing) a fuse bank in such manner are potentially reduced programming time at memory probe or testing, a reduction in fuse read current, and a potentially slight improvement in yield (because if fewer fuses are blown, then the chance of picking a defective fuse is reduced). It is observed that any fuse bank can still repair any address if enable fuses are also present, however, using the above-discussed fuse bank selection method along with effective default state inversion of a fuse element, it may be possible to optimize which bank is used, and a reduction in the number of fuse blows may justify the extra effort.

Figure 7:
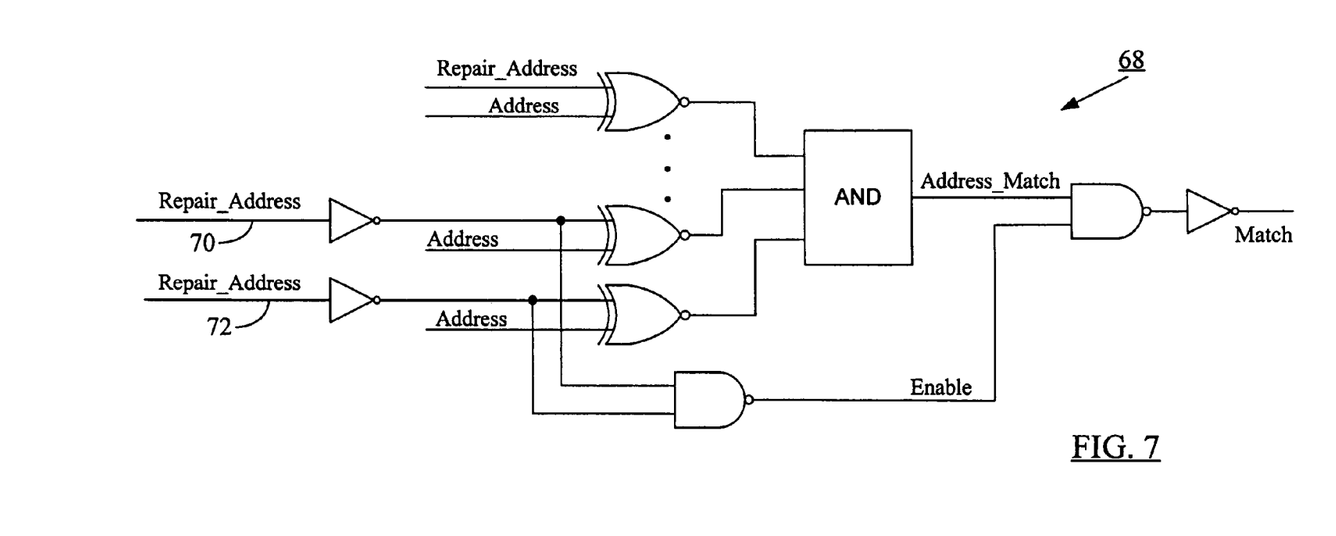
FIG. 7 illustrates how enable fuses may be completely avoided in a fuse design by using the two least significant bits (LSB's) of the non-redundant memory address to generate an enable signal for a fuse element according to one embodiment of the present disclosure.

FIG. 7 illustrates how enable fuses may be completely avoided in a fuse design by using two least significant bits (LSB's) 70, 72 of the non-redundant memory address (on line 17 in FIG. 6) to generate an enable signal for a fuse element according to one embodiment of the present disclosure. FIG. 7 is a high level diagram of a comparator circuit 68. The enable signal in the embodiment of FIG. 7 is generated from two LSB's 70, 72 of the memory address of the defective non-redundant memory location. Instead of requiring an enable fuse and latch (as in the prior art) to provide an enable signal for the fuse bank, two of the address bits (e.g., two LSB's 70, 72) are selected to act as the enable. Also, in the example of FIG. 7, the two bits 70, 72 are inverted to provide a default match to a logic "high" rather than a logic "low". That is, the default unprogrammed state of "00" of the two fuses would provide an initial (default) match with the external address bits (LSB's) "11". Also, with the two fuses in the default unprogrammed state "00", both NAND gate inputs are high, and, hence, the Enable signal is low preventing any match from occurring (i.e., the "Match" signal output is low). If either of the two address LSB fuses (providing the Repair_Addresses 70, 72) is programmed, the Enable output of the NAND gate will go "high" to enable the fuse bank. Hence, the fuse bank of FIG. 7 may be used to repair an address (on lines 17) where both LSB's are either "00", "10", or "01", but may not be used to repair an address where both LSBs are "11" or "high" (i.e., where both LSB's on line 17 equal the inverted values of the defaults of lines 70, 72). An additional fuse bank or fuse banks may be provided where the addresses used as the enables are not first inverted. For example, an OR function (instead of the NAND function) can be used in the circuit configuration of FIG. 7 (but without the inverters for two Repair_Address LSB's) to generate the Enable signal and also to repair all addresses except addresses with both LSBs "low."

Thus, the embodiment of FIG. 7 illustrates how to use different default address states of the two LSBs (of the Repair_Address stored in the fuse bank) and look at these two fuses to create an enable if either of them is blown. In this configuration devoid of separate enable fuses, a given fuse element may be able to repair 75% of possible addresses (i.e., any address except the 1 of 4 that match the default or inverted of the default of the two LSBs of the Repair_Address, depending on whether default state inversion is present or not). For example, a typical memory chip (e.g., the chip 12 in FIG. 1) may have all addresses default to state zero (or "low") with an enable fuse to enable the bank. Instead, using the enable fuse-less configuration similar to that shown in FIG. 7, some of the fuse banks may be designed with two bits of the default address to be 01, 10, and/or 11. For a bank with the two bits with default address 11, the presence of a zero from either of these two fuse bits can act as an enable for the bank. Thus, banks with the two bits with default 11 can repair any address (on lines 17) except an address where the two corresponding bits are 11 (assuming no default state inversion). That is, any bank may repair up to 75% of possible addresses. Thus, with just half of the banks with two bits defaulted to 00 (either one programmed high acts as an enable) and half of the banks defaulted to 11, all address combinations may be repaired and no extra enable fuses may be required.

The configuration of FIG. 7 allows for elimination of all enable fuses with no repair address limitations (i.e., it is not necessary to have some banks with an enable fuse to be able to repair address zero). Further, very little additional logic may be needed to create the enable signal because it is not necessary to look at all fuse bits (e.g., only two LSB's may suffice as illustrated in FIG. 7). A configuration similar to that shown in FIG. 7 may result in a small chance of a yield hit if more than 75% of repair addresses (on lines 17) have the same states in the two LSBs. It may be assumed during design of fuse banks that ¼ of banks have two bits defaulting to 00, ¼ to 01, ¼ to 10 and ¼ to 11. If this assumptions turns out to be too great a design limitation, then three bits (e.g., three LSB's of Repair_Address lines) may be used instead of two. Likewise, one LSB alone may work as well (as discussed with reference to FIG. 8 hereinbelow), but, in that case, half of the fuse banks may be essentially pointing to even addresses and half to odd addresses. In this case, for example, if there are a total of 1000 redundant columns but more than 500 of them had bad even addresses to repair, then the die (containing the memory chip) would not be completely repairable. On the other hand, in the two LSBs embodiment of FIG. 7, it may be possible to repair more than 500 but less than 750 bad addresses corresponding to a particular two-bit LSB combination (e.g., two default LSB's of "01"). The two-bit LSB embodiment of FIG. 7 may, however, result in a bad die when more than 750 of the total of 1000 redundant columns had bad addresses to repair.

In case of a three-bit implementation (not shown) similar to the two-bit implementation of FIG. 7, a bank with default code of 111 (i.e., after inversion of corresponding Repair_Address bits in a manner similar to that shown in FIG. 7) would be enabled if any one of the three bits is programmed low. This bank can repair ⅞ of all possible addresses. Thus, if there are 1000 redundant elements, for example, then there would be no problem on the die unless more than 875 elements with the same three bit address combination need to be repaired. It is observed that MSB's (most significant bits) may also be used instead of LSB's described hereinbefore, but the use of MSB's may limit repair of large blocks of memory (where many bad bits have the same MSB addresses).

Figure 8:
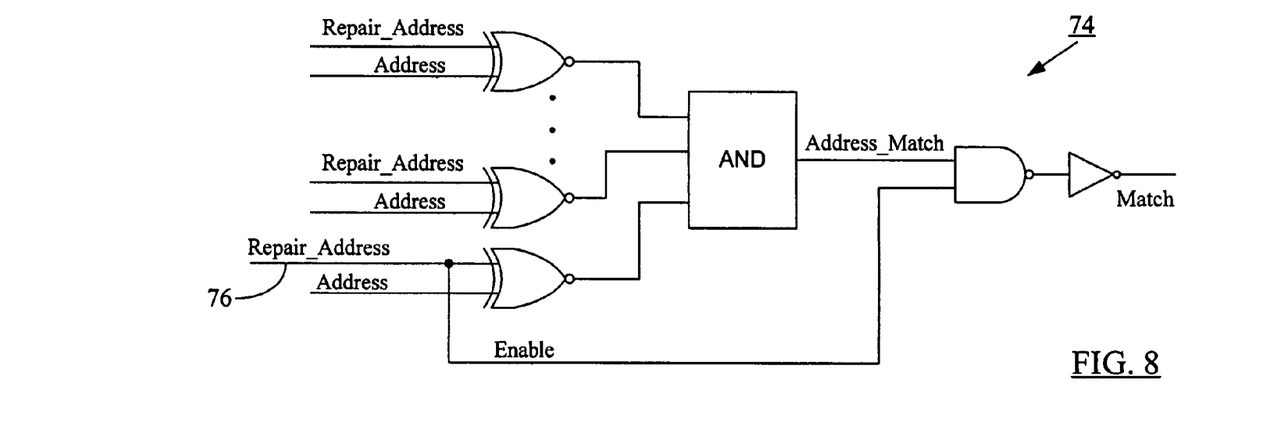
FIG. 8 is a high level diagram of a comparator where a single address bit is used as the fuse enable bit.

FIG. 8 is a high level diagram of a comparator 74 where a single address bit 76 is used as the fuse enable bit. The comparator 74 is similar in principle to the comparator 68 shown in FIG. 7, however a difference between the circuits in FIGS. 7 and 8 is that there is no default state inversion in the embodiment of FIG. 8. In the exemplary configuration of FIG. 8, the fuse bit 76 is default low, and the fuse bank is only enabled if the LSB address bit 76 is programmed "high." Thus, the bank of FIG. 8 may therefore be used to repair any odd address. If the address LSB 76 is inverted (not shown) before the XNOR gate (default state inversion), a match will occur when the address LSB is low and the Repair_Address LSB 76 is high. In this case, the high Repair_Address LSB 76 is again functioning as the enable bit, but only even addresses can be repaired with this configuration. By providing some banks where odd addresses can be repaired, and some where even addresses can be repaired, a memory device may be provided where any address can be repaired, and no enable fuses are required.

Figure 9:
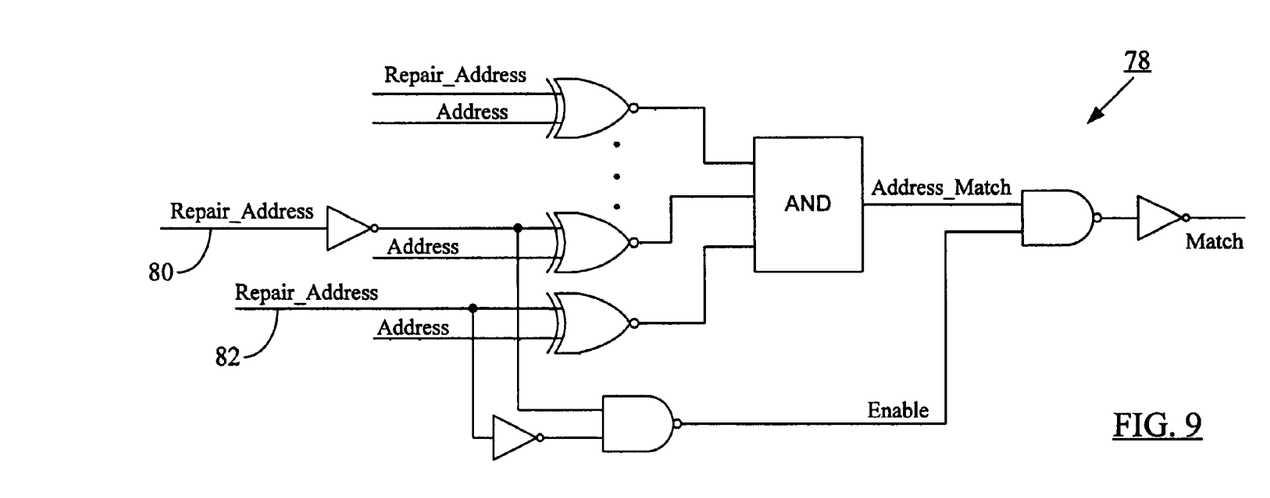
FIG. 9 shows a comparator according to one embodiment of the present disclosure where the default state of two address bits at the input of respective XNOR gates is "10" and the Enable signal is default "low"

FIG. 9 shows a comparator 78 according to one embodiment of the present disclosure where the default state of two address bits 80, 82 at the input of respective XNOR gates is "10" and the Enable signal is default "low." The default state of Repair_Address 80 is "0", but because of the default state inversion, a "high" or "1" signal is input to the corresponding XNOR gate. The default state of Repair_Address bit 82 is also "0" and remains "0" because of absence of inversion. The XNOR inputs are also applied to a NAND gate (with Repair_Address 82 being inverted) to generate the Enable signal as shown in FIG. 9. The fuse bank associated with the comparator 78 may be used to repair any address where the two LSB's (on the address lines 17) are not "10." When either of these two LSB fuses (associated with outputs 80, 82) is blown to match a non-redundant memory address to be repaired, the Enable signal will go high. The fuse bank (not shown) in the circuit configuration of FIG. 9 may be used to repair 75% of all possible addresses. It is observed that default addresses of 00, 01, 10 and 11 may be obtained easily by inverting some or all of the Repair_Address bits (from the latches associated with fuse elements), or the Address bits (in the address bus 17). If some fuse banks are provided where two LSB's of the addresses in the Repair_Address lines match 00 by default, and two match 11, for example, then there may be no limitations on which addresses can be repaired. Thus, different sets of fuse banks with correspondingly different default addresses may be provided as part of the same memory chip.

Figure 10:
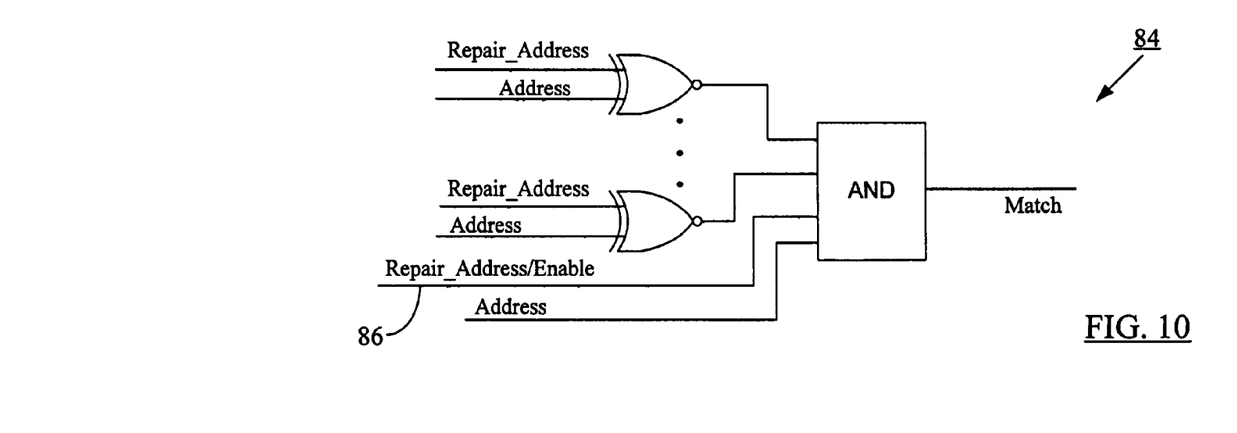
FIG. 10 illustrates a comparator circuit for odd address repair domain.
Figure 11:
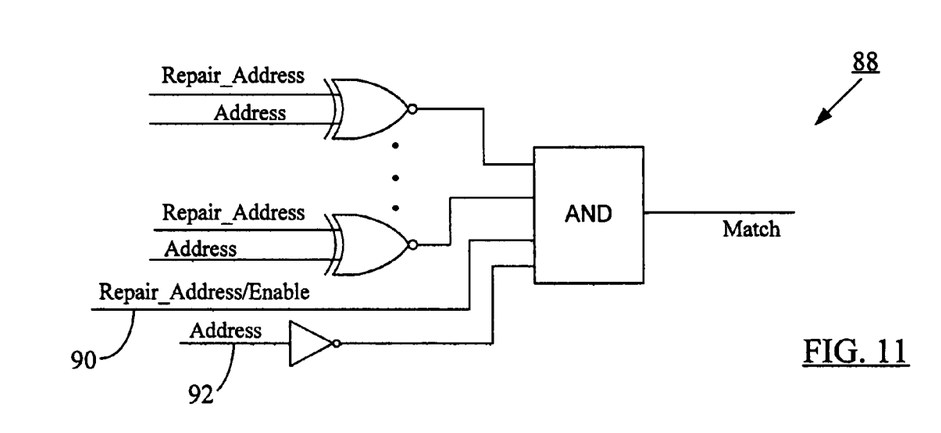
FIG. 11 depicts another comparator circuit for even address repair domain.

FIG. 10 illustrates a comparator circuit 84 for odd address repair domain, whereas FIG. 11 depicts another comparator circuit 88 for even address repair domain. The comparator circuits in FIGS. 10 and 11 may be considered as simplified versions of the comparator circuit 74 shown in the embodiment of FIG. 8. Because the embodiment of FIG. 8 allows for the repair of odd addresses only, the LSB address may not need to be compared with the enable bit (i.e., line 76 in FIG. 8). This approach may result in a simplified comparator configurations shown in FIGS. 10 and 11, each configuration dedicated to a specific, limited address repair domain (e.g., all odd addresses, all even addresses, all addresses except with LSBs=00, etc.). For example, the comparator 84 in FIG. 10 uses LSB of the Repair_Address 86 also as the fuse enable bit (the Enable signal) and feeds the enable bit directly into the AND gate without employing the NAND and inverter combination present in the comparators in FIGS. 7-9 to generate the output Match signal. Thus, the comparator 84 in FIG. 10 may be used to repair all odd addresses. On the other hand, in the comparator 88 of FIG. 11, although the LSB of the Repair_Address and the Enable signal are the same (line 90) as in FIG. 10, the LSB 92 of the incoming address (on lines 17 in FIG. 6) is inverted. The Match signal in FIG. 11 is still generated at the output of the AND gate without the NAND and inverter combination, similar to the configuration in FIG. 10. Thus, the comparator 88 in FIG. 11 may be used to repair all even addresses.

It is seen from the foregoing that the default state inversion discussed hereinbefore may reduce the number of fuses required to be blown. However, selection of a fuse bank with the closest default address to the desired address (i.e., the address to be repaired) may not necessarily eliminate the enable fuses on the die. On the other hand, the LSB-based enable signal generation discussed hereinbefore may allow reduction of total number of fuses on the die by eliminating the need for separate enable fuses. A combination of these two approaches may result in not only smaller number of fuses on the die, but also in reduction in the average number of fuses that need to be blown to repair a given non-redundant memory address.

Figure 12:
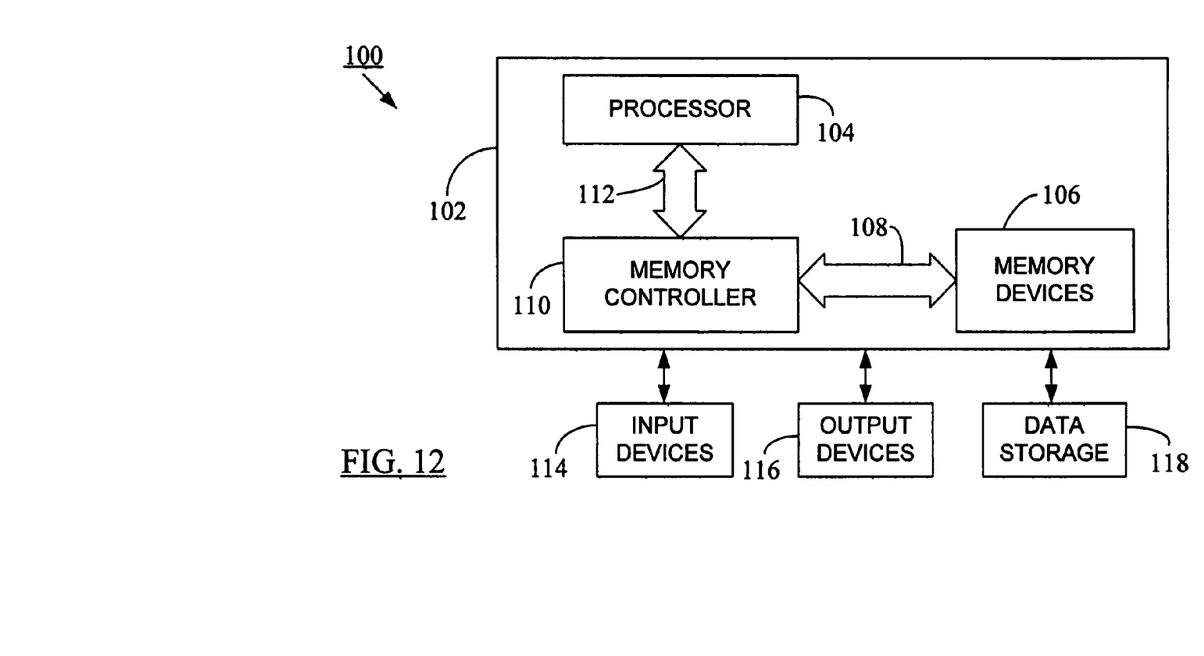
FIG. 12 is a block diagram depicting a system that employs one or more memory devices constructed without enable fuses as per the present disclosure.

FIG. 12 is a block diagram depicting a system 100 that employs one or more memory devices 106 constructed without enable fuses as per the present disclosure. It is observed here that the construction of one or more memory devices 106 may be similar to that of the memory chip 12 shown in FIG. 1, except for the absence of enable fuses and suitable circuit modifications (shown, for example, in FIG. 6) to generate the requisite enable signals as discussed hereinbefore. The system 100 may include a data processing unit or computing unit 102 that includes a processor 104 for performing various computing functions, such as executing specific software to perform specific calculations or data processing tasks. The computing unit 102 may also include memory devices 106 that are in communication with the processor 104 through a bus 108. The bus 108 may include an address bus (not shown), a data bus (not shown), and a control bus (not shown). Each of the memory device 106 can be a dynamic random access memory (DRAM) chip or another type of memory circuits such as SRAM (Static Random Access Memory) chip or Flash memory. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink™ or Rambus™ DRAMs. Those of ordinary skill in the art will readily recognize that a memory device 106 of FIG. 9 is simplified to illustrate one embodiment of a memory device and is not intended to be a detailed illustration of all of the features of a typical memory chip. The processor 104 can perform a plurality of functions based on information and data stored in the memory devices 106. The processor 104 can be a microprocessor, digital signal processor, embedded processor, micro-controller, dedicated memory test chip, or the like.

A memory controller 110 controls data communication to and from the memory devices 106 in response to control signals (not shown) received from the processor 104 over the bus 112. The memory controller 110 may include a command decode circuit (not shown). The command decode circuit may receive the input control signals (on the bus 112) (not shown) to determine the modes of operation of one or more of the memory devices 106. Some examples of the input signals or control signals (not shown in FIG. 12) on the bus 112 (and also on the bus 108) include an External Clock signal, a Chip Select signal, a Row Access Strobe signal, a Column Access Strobe signal, a Write Enable signal, etc.

The system 100 may include one or more input devices 114 (e.g., a keyboard, a mouse, etc.) connected to the computing unit 102 to allow a user to manually input data, instructions, etc., to operate the computing unit 102. One or more output devices 116 connected to the computing unit 102 may also be provided as part of the system 100 to display or otherwise output data generated by the processor 104. Examples of output devices 116 include printers, video terminals or video display units (VDUs). In one embodiment, the system 100 also includes one or more data storage devices 118 connected to the data processing unit 102 to allow the processor 104 to store data in or retrieve data from internal or external storage media (not shown). Examples of typical data storage devices 118 include drives that accept hard and floppy disks, CD-ROMs (compact disk read-only memories), and tape cassettes.

The foregoing describes a memory chip design methodology wherein fuse banks on the memory chip may be implemented without enable fuses. A fuse bank may be enabled by using one or more least significant bits (LSBs) in the memory address stored in the fuse bank, thereby avoiding the need for a separate enable fuse. A reduction in the number of fuses results in space savings on the memory chip real estate and also savings in power consumption because of fewer fuses to be blown and read. With reduced fuse count, the yield of the memory chip's die may also be improved because of less number of defective fuses or failed fuse blows. The use of effective default state inversion for address fuses may further reduce the average number of fuses that need to be blown to repair a given non-redundant memory address.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A circuit for use in a memory device, comprising:
   a fuse bank having a plurality of fuse elements, wherein said fuse bank does not contain an enable fuse element, each of said plurality of fuse elements corresponding to a bit of an internal memory address signal;
   a first circuit that detects a change from a perceived default state of a fuse element in said fuse bank and outputs an enable signal in response to the change from said perceived default state; and
   a second circuit for changing said perceived default state of said fuse element.

2. The circuit of claim 1, wherein said second circuit for changing said perceived default state of said fuse element includes an inverter circuit.

3. The circuit of claim 1, wherein each of said plurality of fuse elements is configurable to provide a corresponding bit of an internal memory address signal that relates to a memory address of a defective memory location.

4. The circuit of claim 2 wherein said first circuit includes a logic gate.

5. The circuit of claim 4 wherein said logic gate includes a NAND gate.

6. The circuit of claim 1, wherein said second circuit is configured to change said perceived default state of one or more but not all fuse elements in said fuse bank.

7. The circuit of claim 1, wherein the second circuit is positioned between said fuse bank and said first circuit.

* * * * *